United States Patent
Froehner

Patent Number: 5,827,759
Date of Patent: Oct. 27, 1998

[54] METHOD OF MANUFACTURING A FUSE STRUCTURE

[75] Inventor: Karl-Heinz Froehner, Hopewell Junction, N.Y.

[73] Assignee: Siemens Microelectronics, Inc., Cupertino, Calif.

[21] Appl. No.: 781,571

[22] Filed: Jan. 9, 1997

Related U.S. Application Data

[62] Division of Ser. No. 365,670, Dec. 29, 1994, abandoned.

[51] Int. Cl.$^6$ ................................................ H01L 21/82
[52] U.S. Cl. .................. 438/132; 438/601; 148/DIG. 55
[58] Field of Search .................... 148/DIG. 55; 438/132, 438/601

[56] References Cited

U.S. PATENT DOCUMENTS

| | | | |
|---|---|---|---|
| 4,413,272 | 11/1983 | Mochizuki et al. | 357/65 |
| 4,536,948 | 8/1985 | Te Velde et al. | 29/577 C |
| 4,581,628 | 4/1986 | Miyauchi et al. | 357/71 |
| 4,598,462 | 7/1986 | Chandrasekhar | 29/577 C |
| 4,602,420 | 7/1986 | Saito | 29/571 |
| 4,665,295 | 5/1987 | McDavid | 437/60 |
| 4,751,197 | 6/1988 | Wills | 437/174 |
| 4,795,720 | 1/1989 | Kawanabe et al. | 437/52 |
| 4,810,663 | 3/1989 | Raffel et al. | 437/19 |
| 4,875,086 | 10/1989 | Malhi et al. | 357/54 |
| 4,912,066 | 3/1990 | Wills | 437/173 |
| 4,968,643 | 11/1990 | Mukai | 437/174 |
| 5,025,300 | 6/1991 | Billig et al. | 357/51 |
| 5,185,291 | 2/1993 | Fischer et al. | 437/173 |
| 5,241,496 | 8/1993 | Lowrey et al. | 365/96 |
| 5,282,158 | 1/1994 | Lee | 365/96 |
| 5,387,555 | 2/1995 | Linn et al. | 437/225 |
| 5,392,187 | 2/1995 | Baliga | 361/111 |
| 5,395,797 | 3/1995 | Chen et al. | 437/195 |
| 5,416,355 | 5/1995 | Kudoh | 257/529 |
| 5,472,901 | 12/1995 | Kapoor | 437/60 |

FOREIGN PATENT DOCUMENTS

| | | | |
|---|---|---|---|
| 3728979A | 3/1989 | Germany | 257/530 |
| 56-94661 | 7/1981 | Japan . | |
| 59-104155 | 6/1984 | Japan . | |
| 63-29953 | 2/1988 | Japan | 257/758 |
| 63-283060 | 11/1988 | Japan | 257/758 |

Primary Examiner—Jey Tsai
Attorney, Agent, or Firm—Stanton C. Braden

[57] ABSTRACT

A programmable fuse element disposed between integrated circuit elements that may be selectively joined during the manufacture or programming of an integrated circuit. The fuse element is a normally open fuse that electrically isolates the integrated circuit elements. The fuse element is comprised of a central area of conductive material insulated from the integrated circuit elements by areas of dielectric material. The integrated circuit elements and the fuse element are disposed on a thin oxide layer covering a semiconductor substrate to prevent those elements from shorting to the semiconductor substrate or to each other via the semiconductor substrate. A protective dielectric layer may be deposited over both the fuse element and the integrated circuit elements during the manufacture of the overall integrated circuit. A laser beam is used to burn through the protective layer and melts both the conductive material and the dielectric material that form the fuse element. As the fuse element melts, the conductive material contacts the integrated circuit elements thereby electrically coupling the integrated circuit elements together creating a low-resistance path.

7 Claims, 4 Drawing Sheets

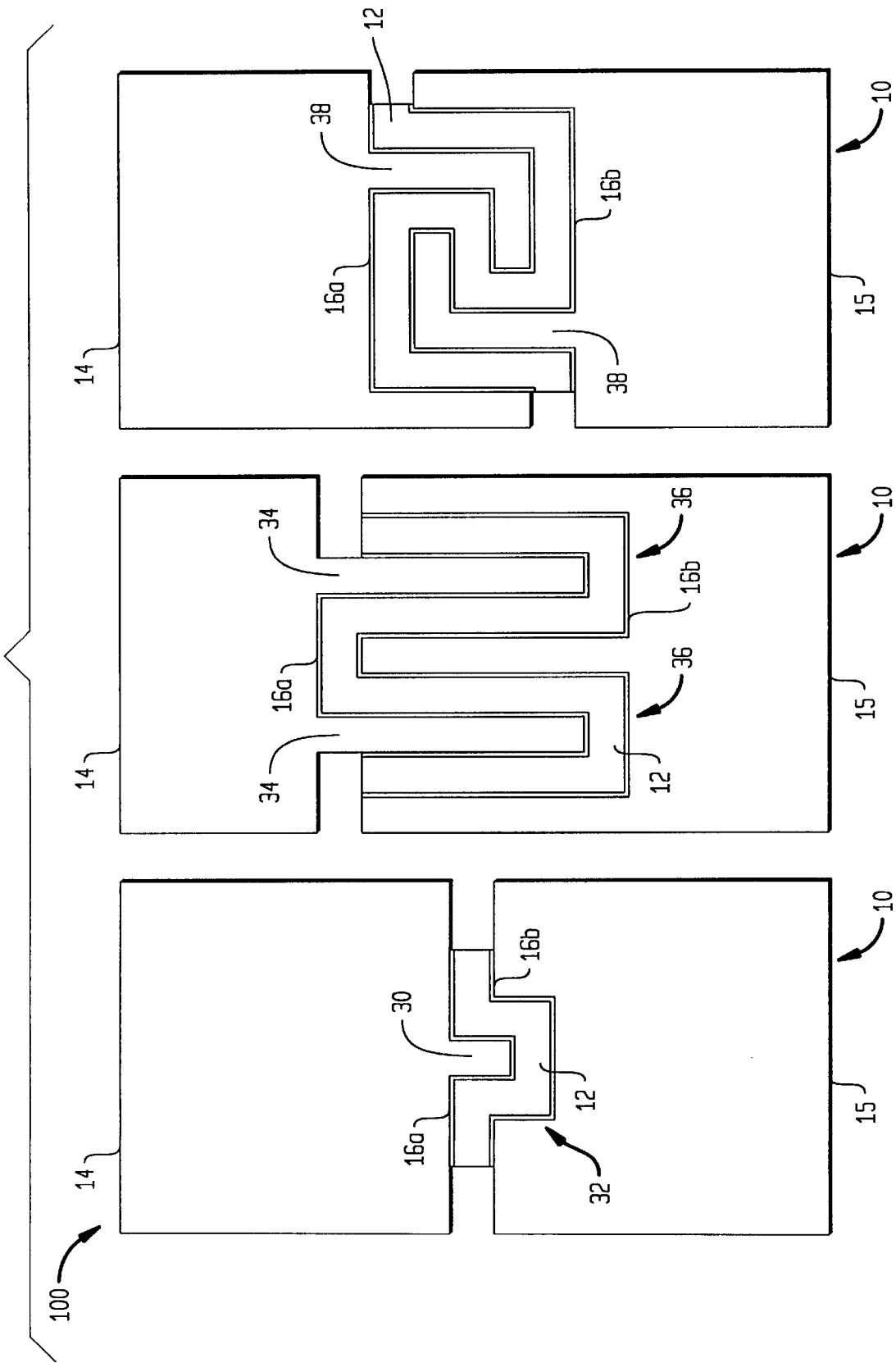

METHOD OF MANUFACTURING A FUSE STRUCTURE

This is a divisional of application Ser. No. 08/365,670 filed Dec. 29, 1994, abandoned.

FIELD OF THE INVENTION

The present invention relates to a fuse element used in conjunction with semiconductor integrated circuits to selectively remove defective circuits from a redundant circuit bank. More specifically, the present invention relates to the structure of a normally open fuse element and the method by which the fuse element is closed.

BACKGROUND OF THE INVENTION

Semiconductor integrated circuits contain a large number of electronic devices such as diodes and transistors built onto a single crystal or chip, often made of silicon. Since these devices are so small, their operational integrity is very susceptible to imperfections or impurities in the crystal. The failure of a single transistor in a circuit may render that circuit non-functional.

In order to circumvent this problem, the semiconductor industry regularly builds redundant circuits on the same chip. Therefore, if a faulty circuit is discovered during testing, the faulty circuit can be disabled and its redundant circuit enabled. In the case of memory integrated circuits, memory cells are usually arranged in rows and columns. Each memory cell is addressed by a particular row and column. By blowing or enabling the correct combination of fuses, circuitry which addresses the faulty element, such as a particular memory cell can be replaced with circuitry which addresses a corresponding redundant element.

The prior art illustrates two common methods for isolating defective circuits. The first is blowing a normally closed fuse. The second is closing a normally open fuse. Both types of fuses are designed for the purpose of enabling a redundant circuit to perform the task of a defective circuit.

Often, the switching to a redundant circuit is accomplished by blowing certain normally closed fuses, thereby isolating the defective circuit. Severing normally closed fuses has certain disadvantages. The prior art illustrates many types of fuses that are opened by the application of a large current. The fuse is heated and the material making up the fusible element melts to open the circuit. One disadvantage of this type of technique is the fuse material may splatter as it blows, landing on the surface of the device, thereby possibly destroying the device. The current applied to the fuse must be carefully calculated based on the cross-sectional area of the fuse element. It is possible to reduce the energy required to sever the link by using a fuse with a reduced cross-sectional area, but this also has the effect of reducing the peak current that can be applied to the conductive path where the fuse is located. Such a prior art technique is exemplified by U.S. Pat. No. 4,536,948, to Te Velde et al. entitled METHOD OF MANUFACTURING PROGRAMMABLE SEMICONDUCTOR DEVICE.

Another prior art method of opening normally closed fuses is to sever the fuse with a laser beam. This method requires that an opening in the outer protective layer be etched over the fuse so that the laser beam can sever the fuse. One disadvantage of this method is that the fuse remains exposed to contaminants during fabrication. Another disadvantage is that the fuse must be covered with a protective layer after it is severed because there is a risk of corrosion. This method also has the similar disadvantage of blowing a fuse with electrical current because debris is created during fusing, thereby possibly rendering the semiconducting device inoperative. Examples of this method are disclosed in U.S. Pat. No. 4,795,720, to Kawanabe et al. entitled METHOD FOR PRODUCING SEMICONDUCTOR DEVICES AND CUTTING FUSES, and in U.S. Pat. No. 5,185,291, to Fischer et al. entitled METHOD OF MAKING SEVERABLE CONDUCTIVE PATH IN AN INTEGRATED-CIRCUIT DEVICE.

However, switching to redundant circuits may also be accomplished by selectively closing a normally open fuse to enable functional circuits and isolate the defective circuits. The fuse is typically fabricated in horizontal layers with a lower conducting layer and an upper conducting layer separated by a middle insulating layer. A laser beam is used to heat the fuse, thereby breaking down the insulating layer and melting the upper and lower conducting layers together, closing the fuse. A disadvantage of this technique is the laser energy applied to the fuse must be carefully calculated to preserve the desired electrical path because the laser beam must pass through one of the conducting layers. Another disadvantage of this technique is the fuse is preferably fabricated without a protective layer, possibly exposing the fuse to contaminants. Such a prior art technique is characterized by U.S. Pat. No. 4,810,663, to Raffel et al. entitled METHOD OF FORMING CONDUCTIVE PATH BY LOW POWER LASER PULSE and by U.S. Pat. No. 4,912,066, to Wills entitled MAKE-LINK PROGRAMMING OF SEMICONDUCTOR DEVICES USING LASER-ENHANCED THERMAL BREAKDOWN OF INSULATOR.

Another type of fuse which is normally open is a link formed where two conducting layers are separated by an insulating layer having an etched hole or a trench. This type of fuse is constructed with a lower conducting layer covered by an insulating layer. An opening is etched in the insulating layer. An upper conducting layer is then deposited on the surface of the insulating layer, but in a manner such that the etched opening is not filled with material. A laser beam directed at the opening melts the upper conducting layer which drains into the opening and shorts the upper conducting layer to the lower conducting layer. One disadvantage of this method is that it is necessary for the upper conducting to be deposited with some of the material overhanging the edge of the opening in order for there to be enough material to fill the opening and short the conductors. Another disadvantage to this method is that the structure of this device limits the type of laser that can be used to short the conductors. If the laser energy density is too low, the upper conductive and lower conductive layers will not melt together. If the laser energy density is too high, the conductive layers will be damaged. An example of this prior art method is disclosed in U.S. Pat. No. 4,968,643, to Mukai entitled, METHOD FOR FABRICATING AN ACTIVABLE CONDUCTING LINK FOR METALLIC CONDUCTIVE WIRING IN A SEMICONDUCTOR DEVICE.

Another fuse utilizing a hole in the insulating layer to connect two conducting layers is disclosed in U.S. Pat. No. 4,751,197, to Wills entitled MAKE-LINK PROGRAMMING OF SEMICONDUCTOR DEVICES USING LASER-ENHANCED THERMAL BREAKDOWN OF INSULATOR. In this patent, a lower conductor is covered by an insulating layer. A hole is etched into the insulating layer. Within the hole is deposited a thin conductor layer which contacts the lower conductor. A low doped polysilicon layer is deposited over the thin conductor layer. The polysilicon serves as an insulator because it is highly resistive in this form. A metal layer is deposited over the polysilicon layer to fill the remainder of the hole. An upper conducting layer is deposited over the insulting layer and the filled hole. A laser beam directed at the filled hole causes the materials within the hole and the upper and lower conducting layers to react with one another, closing the fuse. One disadvantage of this technique is that it requires an elaborate process to fabricate the fuse. Another disadvantage is that combination of materials which make up the fuse is limited because the materials must electrically interact with each other under the application of laser energy, otherwise the fuse will not close.

The prior art demonstrates there is a need for a fusible element that is small enough to be placed anywhere on the semiconducting device without the need for an elaborate manufacturing process or undue restrictions on the design of the fuse. It is, therefor, an object of this invention to create a more reliable, smaller, simpler fuse that does not need to be located in banks. It is a further object of this invention to provide a fusible structure that is less sensitive to etch variations in the oxide layers and more resistant to corrosion.

SUMMARY OF THE INVENTION

The present invention is a normally open fuse element used in conjunction with semiconductor integrated circuits to selectively remove defective circuits from a redundant circuit bank. The fuse element is comprised of a central area of conductive material insulated from a plurality of integrated circuit elements by areas of dielectric material. The integrated circuit elements and the present invention fuse element are disposed on a semiconductor substrate. A thin oxide layer is disposed on the substrate, below the fuse element and the integrated circuit elements to prevent those elements from shorting to the semiconductor substrate or to each other via the semiconductor substrate. A protective dielectric layer may be deposited over both the fuse element and the two integrated circuit elements during the manufacture of the overall integrated circuit.

To electrically join the integrated circuit elements a laser beam is directed toward the fuse element. The laser beam burns through the protective dielectric layer and melts both the conductive material and the dielectric material that form the fuse element. As the fuse element melts, the conductive material contacts the two integrated circuit elements thereby electrically coupling the two integrated circuit elements together.

BRIEF DESCRIPTION OF THE FIGURES

FIG. 9 is a top-view of the present invention fuse structure arranged in a bank.

DETAILED DESCRIPTION OF THE FIGURES

Figure 1:
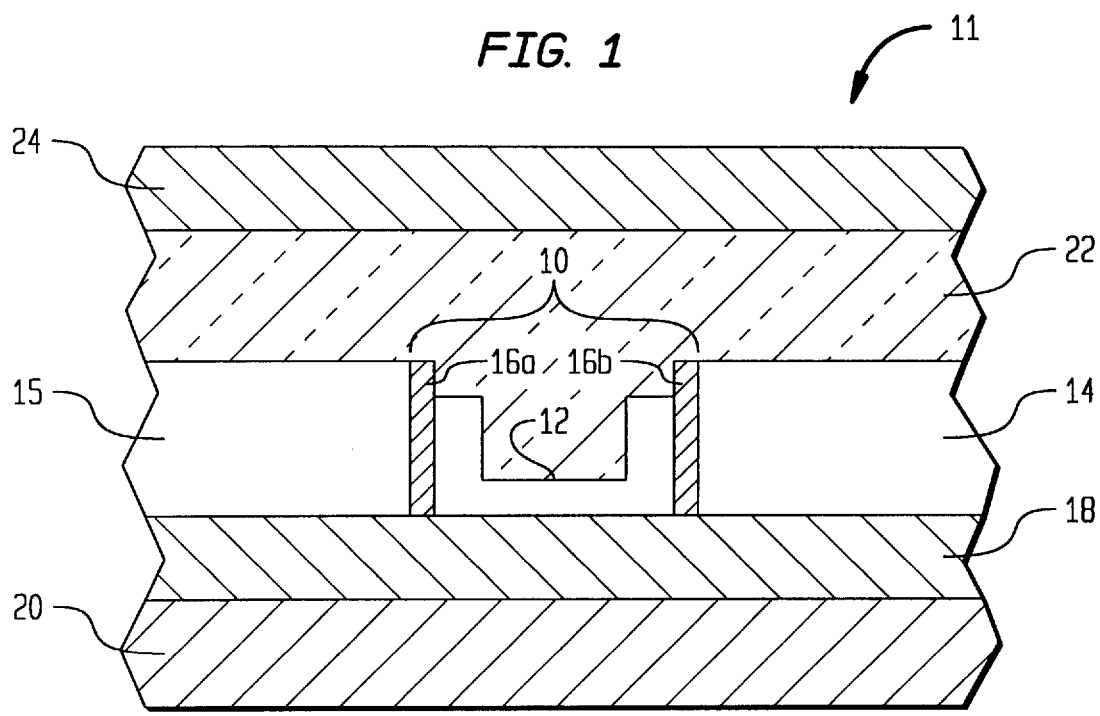
FIG. 1 is a cross-sectional view of the preferred embodiment in its normally "open" state.

Referring to FIG. 1 a preferred embodiment of the present invention fuse element 10 is shown disposed between integrated circuit elements 14, 15. The integrated circuit elements 14, 15 may be any component leads that may be selectively joined during the manufacture or programming of the overall integrated circuit 11. In the shown embodiment, the fuse element 10 is a normally open fuse that electrically isolates the integrated circuit elements 14, 15.

The fuse element 10 is comprised of a central area of conductive material 12 insulated from the integrated circuit elements 14, 15 by areas of dielectric material 16. For reasons which will later become obvious, both the conductive material 12 and the dielectric material 16 are made of materials that readily absorb laser radiation and are easily melted. In a preferred embodiment, the conductive material 12 is polysilicon and the dielectric material 16 is composed of silicon oxide or silicon nitride.

In the shown embodiment, the integrated circuit elements 14, 15 and the present invention fuse element 10 are disposed on a semiconductor substrate 20. A thin oxide layer 18 is disposed on the substrate, below the fuse element 10 and the integrated circuit elements 14, 15 to prevent those elements from shorting to the semiconductor substrate 20 or to each other via the semiconductor substrate 20. At least one protective dielectric layer 22 may be deposited over both the fuse element 10 and the integrated circuit elements 14, 15 during the manufacture of the overall integrated circuit 11. In the preferred embodiment, the protective dielectric layer 22 is phospho-silicate glass (PSG) which is substantially transparent. As will be explained, a transparent layer helps in targeting a laser on the fuse element 10 and diminishes the amount of optical energy transmitted to the non-fuse elements of the integrated circuit 11.

Figure 2:
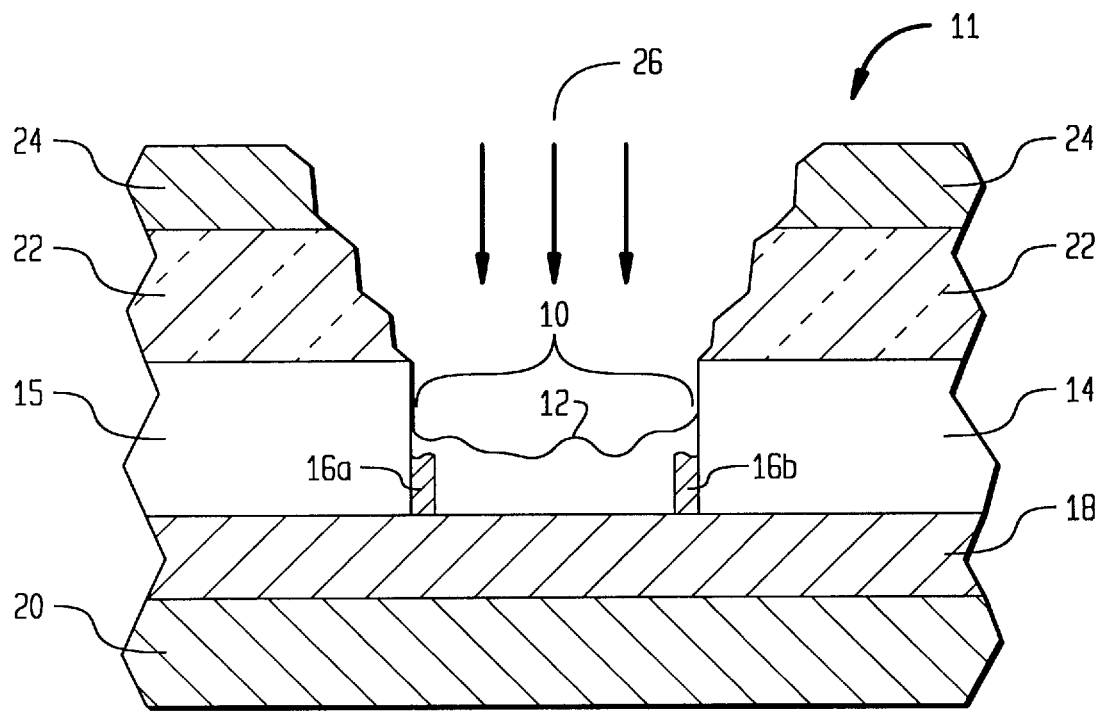
FIG. 2 is a cross-sectional view of the preferred embodiment in a "closed" state.

Referring to FIG. 2, it can be seen that to electrically join the two integrated circuit elements 14, 15 a laser beam 26 is directed toward the fuse element 10. The laser beam 26 bums through the protective dielectric layer 22 and melts both the conductive material 12 and the dielectric material 16 that form the fuse element 10. As the fuse element 10 melts, the dielectric material 16 breaks down. The molten conductive material 12 contacts the integrated circuit elements 14, 15 thereby electrically coupling the integrated circuit elements 14, 15 together. As a result, the fuse element 10 is changed from its original normally "open" condition to a "closed" condition. In the preferred embodiment, the resistance of the "closed" fuse element 10 is less than 1 kΩ.

Figure 3:
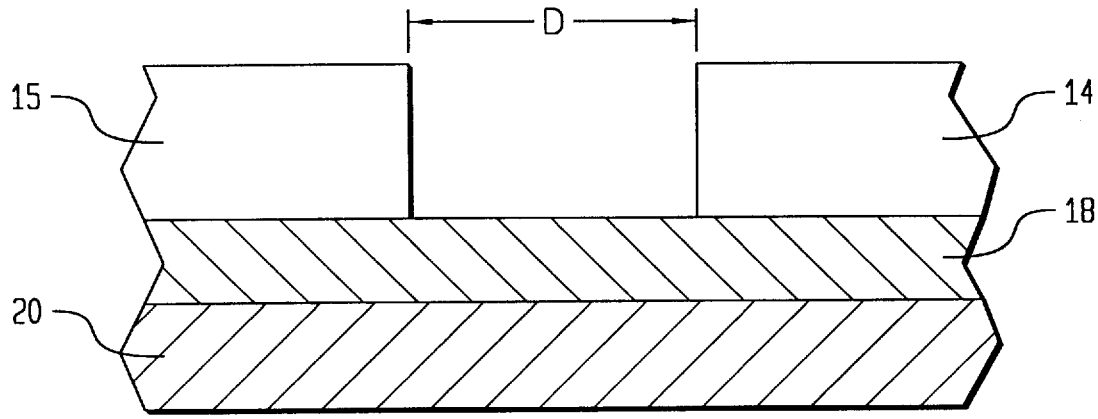
FIGS. 3 to 8 are cross-sectional views of preferred embodiment showing various steps of in manufacture of this invention.
Figure 4:
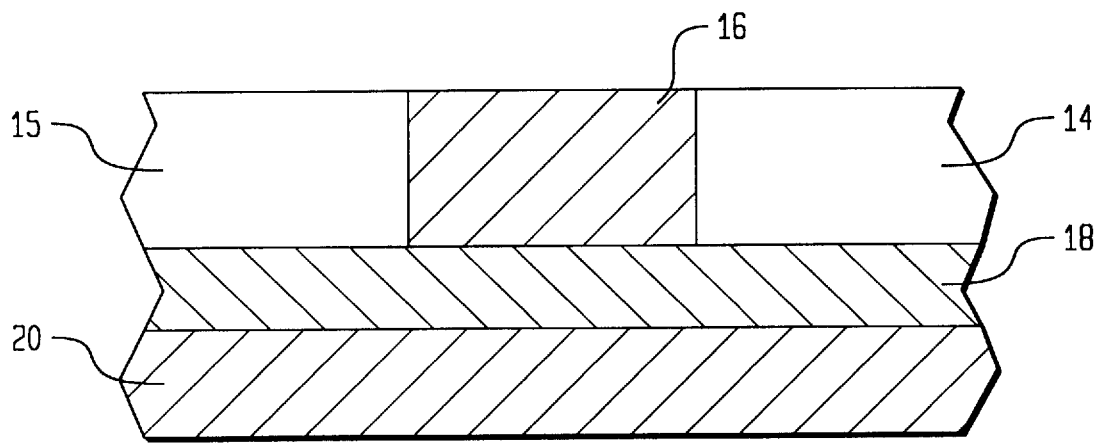
Figure 5:
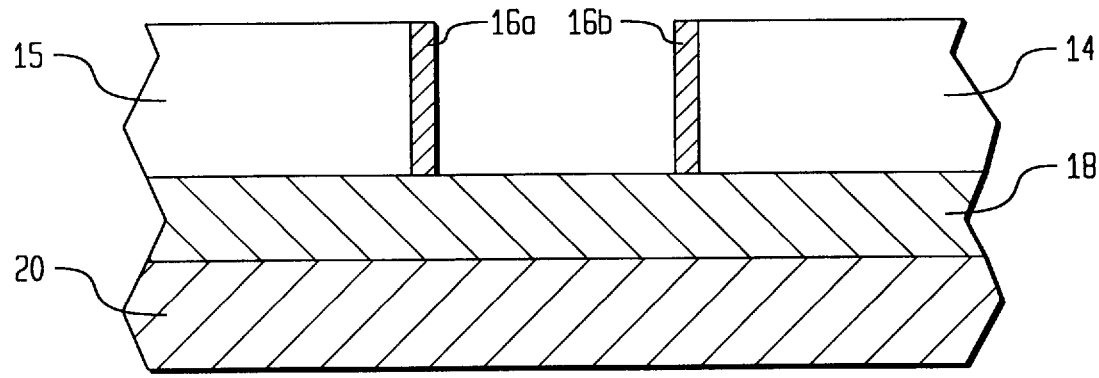
Figure 6:
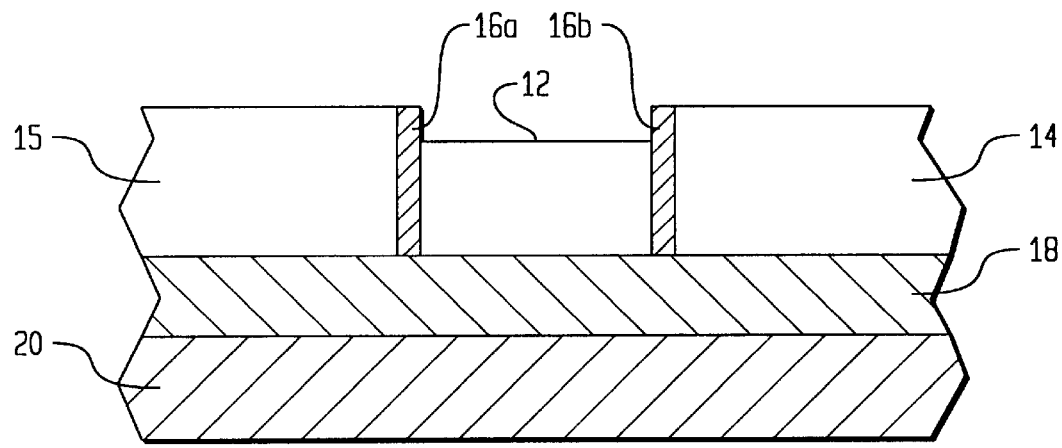
Figure 7:
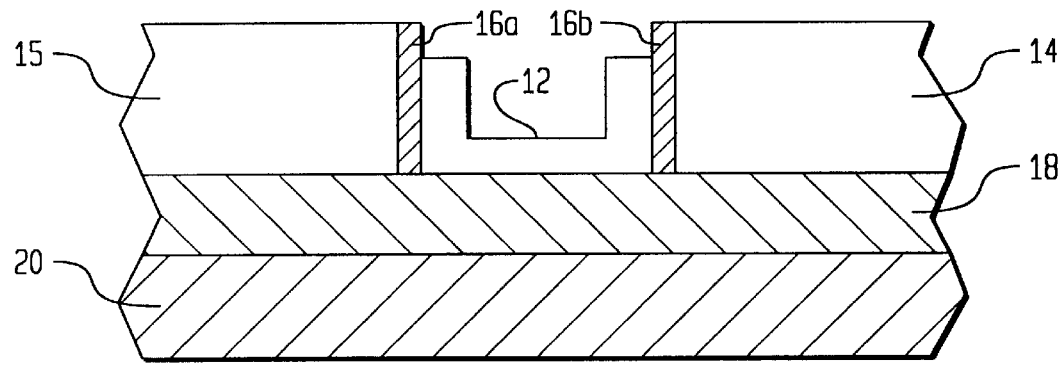

Referring to FIG. 3, it can be seen that to manufacture the present invention fuse element 10, the two integrated circuit elements 14, 15 are first formed on a thin oxide layer 18 of the semiconductor substrate 20. A distance D is left between the integrated circuit elements 14, 15 to later compensate the fuse element 10. In a preferred embodiment, the distance D between integrated circuit elements 14, 15 is about 0.5 $\mu$m, however other dimensions can be used depending upon the minimum design rules of the manufacturing process. A layer of dielectric material 16 is deposited using conventional techniques known in the art between integrated circuit elements 14, 15 as shown in FIG. 4. A center region of the deposited dielectric material 16 is etched away using a suitable mask, to form vertical dielectric spacers 16a, 16b. The dielectric spacers 16a, 16b are located on the facing sides of the integrated circuit elements 14, 15 as shown in FIG. 5. A layer of conductive material 12 is deposited between the dielectric spacers 16a, 16b as shown in FIG. 6. The thickness of the layer of conductive material 12 is less than the thickness of the integrated circuit elements 14, 15. A center portion of the conductive material 12 is etched away to form a U-shaped structure with a short middle section and two vertical sides of approximately the same thickness as shown in FIG. 7. This shape positions the majority of the conductive material 12 proximate the dielectric spacers 16a, 16b. As such, when laser energy is applied the majority of the molten conductive material is in a position to bypass the melted dielectric material and contact the integrated circuit elements.

Figure 8:
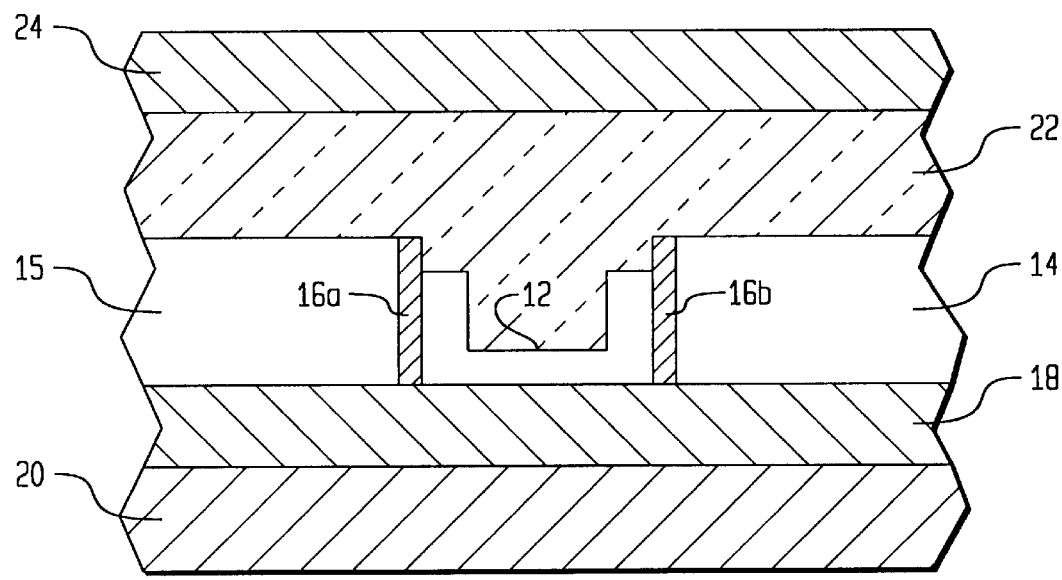

The manufacturing of the fuse element 10 is complete at this point. The fuse element 10 may be covered by a transparent protective dielectric layer 22 and one or more cap layers 24 as shown in FIG. 8. In the preferred embodiment, the cap layers 24 are formed from an oxide. The protective dielectric layer 22 and the cap layers 24 covering the fuse element 10 are located at the top of the semiconducting device and prevent external contaminants from contacting the fuse element 10. However, the fuse element 10 described herein can be manufactured as an open structure without any protective layers.

Referring to FIG. 9, there is illustrated a bank 100 of fuse elements 10 formed on a semiconductor substrate 20. Each fuse element 10 has a different design based on the electrical characteristics of the circuit to be connected and the materials chosen for the conductive material 12 and the integrated circuit elements 14, 15. Moving from left to right in FIG. 9, the first fuse element 10 is generally U-shaped and is formed between a section 30 of integrated circuit element 14 which protrudes into a recess 32 formed in integrated circuit element 15. This design has the advantage of being simple and easy to fabricate. The second fuse element 10 is generally W-shaped and is formed between two sections 34 of integrated circuit element 14 which protrude into two recesses 36 formed in integrated circuit element 15. This shape maximizes the surface area of each integrated circuit element 14, 15 contacted by the conductive material 12. The third fuse element 10 is generally Z-shaped and formed between integrated circuit elements 14, 15 having interlocking L-shaped 38 protrusions. This shape concentrates the surface area of each area of integrated circuit elements 14, 15 in contact with the conductive material 12 into a center region which is then targeted by the laser beam.

It should be understood that the embodiments described herein are merely exemplary and that a person skilled in the art may make variations and modifications without departing from the spirit and scope of the invention. For example, the spacing between the integrated circuit elements may vary depending upon the design rules. Also, the design of the fuse element may vary due to the electrical characteristics of the circuits to be connected.

What is claim is:

1. A method for manufacturing a fuse structure for selectively joining a first integrated circuit element to a second integrated circuit element which lie in spaced apart relation on a dielectric layer disposed on a semiconductor substrate comprising:

depositing a layer of dielectric material between said first and second integrated circuit elements;

etching away a center region of said dielectric material so as to form a plurality of dielectric spacers abutting said first and second integrated circuit elements;

depositing a conductive material between said dielectric spacers; and etching away a central portion of said conductive material so that said conductive material is thinner at its middle section than at its sides.

2. The method as recited in claim 1 which further comprises:

depositing a protective dielectric layer overall.

3. The method as recited in claim 2 which further comprises covering said protective dielectric layer with at least one cap layer.

4. The method as recited in claim 2 wherein said protective dielectric layer comprises phospho-silicate glass.

5. The method as recited in claim 3 wherein said cap layer comprises an oxide.

6. The method as recited in claim 1 wherein said conductive material is polysilicon.

7. The method as recited in claim 1 wherein said dielectric material consists of silicon oxide or silicon nitride.

* * * * *